(12) United States Patent
Farmer et al.

(10) Patent No.: US 11,444,231 B2
(45) Date of Patent: Sep. 13, 2022

(54) THERMOELECTRIC COATINGS FOR WASTE HEAT RECOVERY AND PHOTO-THERMAL POWER

(71) Applicant: LAWRENCE LIVERMORE NATIONAL SECURITY, LLC, Livermore, CA (US)

(72) Inventors: Joseph C. Farmer, Tracy, CA (US); James Kaschmitter, Pleasanton, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 490 days.

(21) Appl. No.: 15/435,591

(22) Filed: Feb. 17, 2017

(65) Prior Publication Data
US 2017/0162775 A1    Jun. 8, 2017

Related U.S. Application Data

(63) Continuation of application No. 13/049,075, filed on Mar. 16, 2011, now abandoned.

(60) Provisional application No. 61/315,157, filed on Mar. 18, 2010.

(51) Int. Cl.
*H01L 35/32* (2006.01)
*H01L 35/10* (2006.01)
*H01L 35/34* (2006.01)

(52) U.S. Cl.
CPC .............. *H01L 35/32* (2013.01); *H01L 35/10* (2013.01); *H01L 35/34* (2013.01)

(58) Field of Classification Search
CPC .......... H01L 35/32; H01L 35/34; H01L 35/10
See application file for complete search history.

(56) References Cited

U.S. PATENT DOCUMENTS

| | | | |
|---|---|---|---|
| 3,054,840 A | 9/1962 | Alsing | |
| 3,269,872 A | 8/1966 | Thompson | |
| 3,304,207 A | 2/1967 | Kolb et al. | |
| 3,400,452 A * | 9/1968 | Emley | H01L 35/34 136/201 |
| 3,485,680 A * | 12/1969 | Henderson | C23C 4/00 136/201 |
| 3,601,887 A * | 8/1971 | Mitchell | H01L 35/34 438/55 |
| 5,625,245 A | 4/1997 | Bass | |
| 7,397,169 B2 | 7/2008 | Nersessian et al. | |
| 7,414,351 B2 | 8/2008 | Ulm et al. | |
| 2005/0217714 A1 * | 10/2005 | Nishijima | H01L 35/00 136/204 |

(Continued)

FOREIGN PATENT DOCUMENTS

WO    WO-2010051219 A1 *   5/2010  ............. F01N 5/025

*Primary Examiner* — Sadie White
(74) *Attorney, Agent, or Firm* — Eddie E. Scott

(57) ABSTRACT

An energy harvesting system for collecting energy from sources of thermal energy that exist in the environment and convert the energy to electricity. The system has N-P junctions mounted on the outer surface of a conduit, pipe or flue. A hot medium flows through the conduit, pipe or flue. The p-n junctions operate as thermoelectric power generators. Heat absorbed at the p-n junctions increases the kinetic energy of charge carriers causing migration of the charge carriers. This thermally-driven migration of charge carriers is used to drive an electrical current in an external circuit.

3 Claims, 7 Drawing Sheets

(56) References Cited

U.S. PATENT DOCUMENTS

| | | |
|---|---|---|
| 2009/0105988 A1 | 4/2009 | Banerjee et al. |
| 2010/0154855 A1* | 6/2010 | Nemir ............... H01L 35/30 |
| | | 136/205 |
| 2011/0197941 A1* | 8/2011 | Dannoux ............ F01N 5/025 |
| | | 136/201 |

* cited by examiner

THERMOELECTRIC COATINGS FOR WASTE HEAT RECOVERY AND PHOTO-THERMAL POWER

CROSS-REFERENCE TO RELATED APPLICATIONS

The present application is a Continuation of application Ser. No. 13/049,075 filed Mar. 16, 2011, which claims benefit under 35 U.S.C. § 119(e) of U.S. Provisional Patent Application No. 61/315,157 filed Mar. 18, 2010 entitled "Thermoelectric Coatings for Waste Heat Recovery and Photo-Thermal Power," the disclosure of which is hereby incorporated by reference in its entirety for all purposes.

STATEMENT AS TO RIGHTS TO INVENTIONS MADE UNDER FEDERALLY SPONSORED RESEARCH AND DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

BACKGROUND

Field of Endeavor

The present invention relates to energy harvesting and more particularly to a thermoelectric laminate that can convert thermal energy to electricity.

State of Technology

Thermoelectric devices can be used for the recovery of waste heat from chemical processes, vehicle exhaust and solar power plants, thereby increasing the overall efficiency of such systems. Commercial introduction of thermoelectrics has been restricted by low efficiency and high production costs.

U.S. Pat. No. 7,397,169 for energy harvesting using a thermoelectric material issued Jul. 8, 2008 to Nersesse Nersessian, Gregory P. Carman, and Harry B. Radousky, Lawrence Livermore National Laboratory, provides the state of technology information reproduced below:

"Waste heat is always generated whenever work is done. Harvesting such waste heat can increase the efficiency of engines, be used to power numerous devices (eliminating the need for auxiliary power sources), and in general, significantly reduce power requirements. Various methods have been used to try and harvest such waste heat, the most important of which is through thermoelectric materials.

In order to efficiently convert waste heat to usable electrical energy, thermoelectric materials generally requires a large Seebeck coefficient having a "figure of merit" or Z, defined as $Z=S^2/\rho K$, where S is the Seebeck coefficient, $\rho$ is the electrical resistivity, and K is the thermal conductivity. The Seebeck coefficient is further defined as the ratio of the open-circuit voltage to the temperature difference between the hot and cold junctions of a circuit exhibiting the Seebeck effect, or $S=V/(T_h{}^{31}\ {}^T{}_c)$. Therefore, in searching for a good thermoelectric material, materials with large values of S, and low values of $\rho$ and K are beneficial.

However, current state of the art thermoelectric materials utilized to harvest waste heat and convert such heat to a useful energy, for example, devices that use a combination of n-type and p-type materials, generally have Seebeck coefficients on the order of several 100 $\mu V°K^{-1}$, which is too low for practical applications."

SUMMARY

Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

Applicants have developed novel thermoelectric generators with exceptional efficiency that can be cost-effectively fabricated with advanced thermal and cold spray technology. These devices have a cylindrical annular geometry, ideal for process heat exchanger and exhaust manifold applications. Optimal materials and spray technology for device fabrication are selected based upon operating temperature. Dispersions of particles (tens of manometers in size) are used to promote phonon scattering, lower the lattice thermal conductivity, and raise the dimensionless figure-of-merit (ZT). Applicants have developed technical advances that provide the means to overcome low efficiency and high production costs issues.

The basic concept of the present invention is energy harvesting to collect energy from solar or other free sources of thermal energy that exist in the environment and convert them to electricity. In principle, this technique can provide power from low quality sources of energy such as waste heat at low temperatures. Applicants have demonstrated that a bulk compound thermoelectric laminate can convert thermal energy to electricity. When produced as a thin-film material and operated at high thermal cycling frequency Applicants have demonstrated that the power/gram produced by compound thermo-electrics prepared as thin films can potentially exceed that of current solar cells or other energy harvesting techniques.

The present invention has use as energy harvesting systems to collect energy from sources of thermal energy that exist in the environment and convert the energy to electricity. The present invention has use in connection with airplanes, naval ships, ground vehicles, power sources for military bases and communications, and other military uses. The present invention also has use in connection with load leveling, uninterruptable power for computing and telecommunications, electric vehicles, hybrid electric vehicles, and other energy sources.

The invention is susceptible to modifications and alternative forms. Specific embodiments are shown by way of example. It is to be understood that the invention is not limited to the particular forms disclosed. The invention covers all modifications, equivalents, and alternatives falling within the spirit and scope of the invention as defined by the claims.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

DETAILED DESCRIPTION OF SPECIFIC EMBODIMENTS

Figures 1, 2:
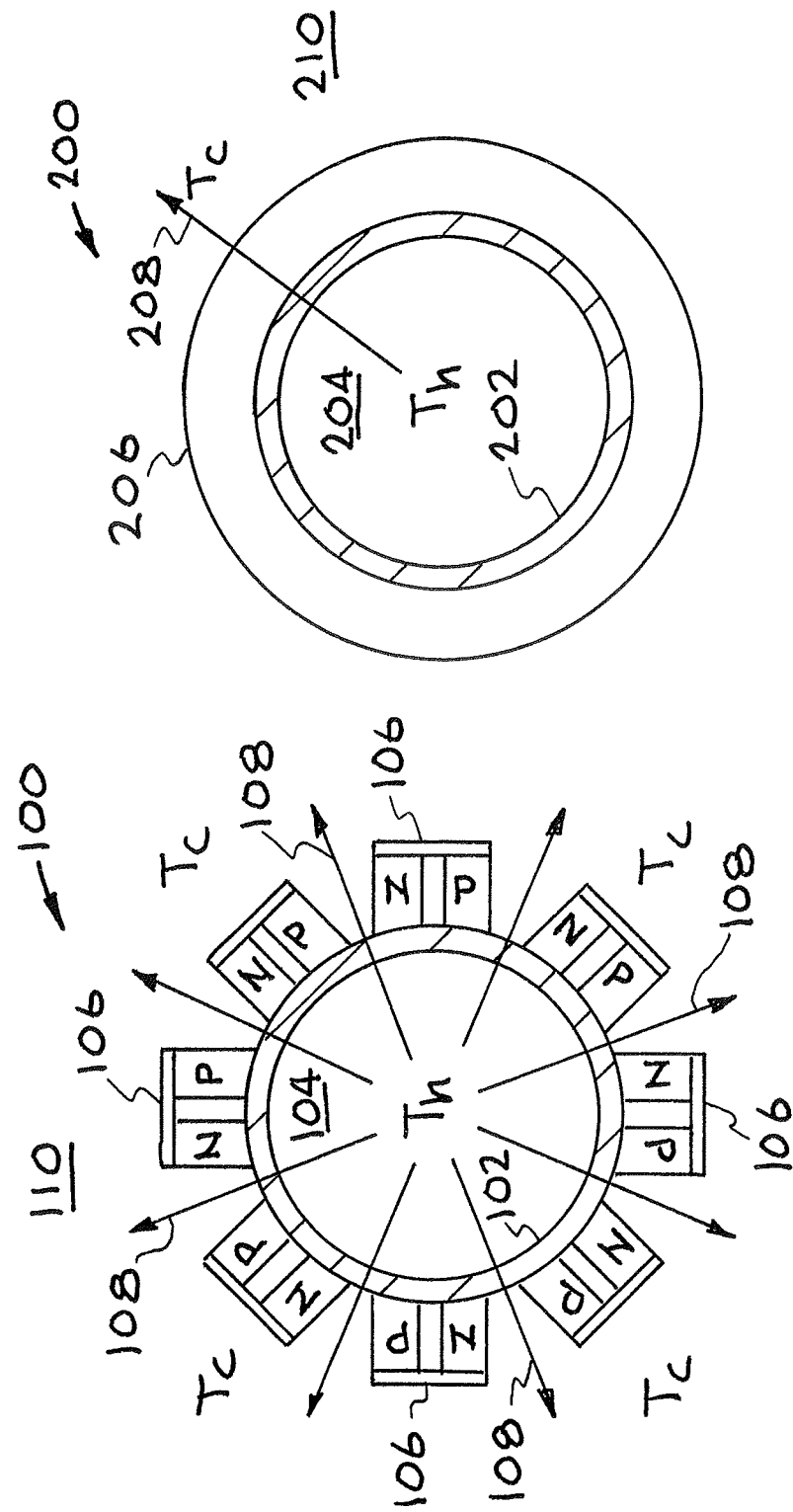
FIG. 1 illustrates a thermoelectric device (TEG).
FIG. 2 illustrates an embodiment of a thermoelectric device (TEG) of the present invention that provides highly efficient thermoelectric power generators.

Referring to the drawings, to the following detailed description, and to incorporated materials, detailed information about the invention is provided including the description of specific embodiments. The detailed description serves to explain the principles of the invention. The invention is susceptible to modifications and alternative forms. The invention is not limited to the particular forms disclosed. The invention covers all modifications, equivalents, and alternatives falling within the spirit and scope of the invention as defined by the claims.

Solid-state thermoelectric generators have no moving parts, and can be used for the reliable direct conversion of heat to electrical energy, with exceptional reliability in remote and inaccessible locations, including deep space. Examples of thermoelectric generators that have been powered by small nuclear reactors and radioisotope sources include: SNAP 10 (reactor-powered thermoelectric generator); SNAP 19 (radioisotope thermoelectric generator); and SNAP 27 (radioisotope thermoelectric generator). Several multilayer thermoelectric thin films have been synthesized via multimagnetron sputtering by Lawrence Livermore National Laboratory (LLNL). It was found that sputtering could be used to grow epitaxial single-layer and multilayer films by carefully controlling the composition of the sputtering target, the substrate bias and temperature, the sputtering gas pressure, and the substrate structure. These materials included: Bi2Te3/B4C; SiO.2GeO.8/Si; BiO.9SbO.1/PbTeO.8SeO.2; BiO.9SbO.1/Bi2Te3; Bi/BiO.86Sb0.14; and others. These films were characterized electronically and structurally. Structural characterization included transmission electron microscopy, X-ray diffraction, and electronic property measurements. In addition to making multilayer films, thin film TE devices were also made and evaluated.

The present invention provides a system for the recovery of waste heat from various sources including chemical processes, vehicle exhaust, and solar power plants. The present invention provides overall efficiency in the recovery of waste heat from various sources. The present invention provides thermoelectric generators with exceptional efficiency that can be cost-effectively fabricated with advanced thermal and cold spray technology. These devices can have a cylindrical annular geometry which is ideal for process heat exchanger and exhaust manifold applications. Optimal materials and spray technology for device fabrication are selected based upon operating temperature. Dispersions of particles (tens of manometers in size) is used to promote phonon scattering, lower the lattice thermal conductivity, and raise the dimensionless figure-of-merit (ZT).

Referring now to the drawings and in particular to FIG. 1, a simplified illustration of a thermoelectric device (TEG) is shown. The thermoelectric device (TEG) is designated generally by the reference numeral 100. U.S. Pat. No. 7,397,169 for energy harvesting using a thermoelectric material issued Jul. 8, 2008 to Nersesse Nersessian, Gregory P. Carman, and Harry B. Radousky, Lawrence Livermore National Laboratory, points out that, "Waste heat is always generated whenever work is done. Harvesting such waste heat can increase the efficiency of engines, be used to power numerous devices (eliminating the need for auxiliary power sources), and in general, significantly reduce power requirements. Various methods have been used to try and harvest such waste heat, the most important of which is through thermoelectric materials." The disclosure of U.S. Pat. No. 7,397,169 for energy harvesting using a thermoelectric material issued Jul. 8, 2008 to Nersesse Nersessian, Gregory P. Carman, and Harry B. Radousky, Lawrence Livermore National Laboratory, is incorporated herein in its entirety for all purposes by this reference.

As illustrated in FIG. 1, the thermoelectric device (TEG) 100 includes a conduit, pipe, or flue 102 that has N-P junctions 106 mounted on the outer surface of pipe 102. A hot medium 104 flows through the pipe 102. Heat will escape through the wall of pipe 102 to the cool or ambient temperature 110 surrounding the pipe 102. The thermoelectric device (TEG) 100 utilizes the p-n junctions 106 as thermoelectric power generators. Heat absorbed at the p-n junctions 106 increases the kinetic energy of charge carriers in the two semiconductor legs of the device, causing migration of the charge carriers to the cold side of the device, where energy is lost to the surroundings. This thermally-driven migration of charge carriers can be used to drive and electrical current in an external circuit attached to the p and n legs of the device. The energy carried the two legs is reflected in the Seebeck coefficients for the p and n materials. The thermoelectric device (TEG) 100 has the shortcoming that, as illustrated by the arrows 108, some heat passes through gaps between the N-P junctions mounted on the outer surface of pipe 102. This heat loss reduces the efficiency of the TEG 100 and the thermoelectric device (TEG) 100 is not as efficient as devices described subsequently.

Referring now to FIG. 2, an embodiment of the present invention is illustrated that provides highly efficient thermoelectric power generators with advanced thermal or cold spray technology, with a cylindrical annular geometry optimized for process heat exchanger and exhaust manifold applications. Optimal materials and spray technology for device fabrication are selected based upon the range of operating temperatures expected. For example, bismuth, antimony and lead telluride alloys deposited cold spray technology are ideal for relatively low to intermediate temperatures, while doped silicon-germanium alloys deposited with advanced thermal spray processes are ideal for high-temperature applications.

FIG. 2 is a simplified illustration of one embodiment of a TEG device constructed in accordance with the present invention. The TEG device shown in FIG. 2 is designated generally by the reference numerals 200. The TEG device 200 has pipe or flue 202 that is completely surrounded for 360 degrees by N-P junctions 206. The heat from the hot medium flowing in pipe 202 and passing out through the wall of pipe 202 on a path indicated by the arrow 208 to the cool or ambient zone 210 all passes through N-P junctions 206. The fact that all of the heat from the hot medium flowing in pipe 202 passes through N-P junctions 206 greatly increases the efficiency of the TEG device 200.

Attempts have been made to enhance ZT through the fabrication of 1D and 2D quantum well devices, but without practical success. Layered structures may have enhanced ZT normal to the layers due to enhanced phonon scattering, and the resultant suppression of the thermal conductivity. However, such devices are usually fabricated with physical or chemical vapor deposition, and have limited thicknesses, and correspondingly limited temperature gradients and device efficiencies. Advanced thermal spray technologies can be used to deposit relatively thick rings of thermoelectric material on cylindrical pipes, with alternating n- and p-type rings forming p-n junctions concentric with fluid flow, in an ideal geometry for heat exchanger and exhaust system applications.

In the case of the spray-on TE generator, nano-disperse particles formed with reverse micelle synthesis will be incorporated into the p and n legs to enhance the dimensionless figure of merit (ZT), through lowering of the thermal conductivity by enhancement of phonon scattering in the bulk material, without carrier trapping.

Alternative methods of producing rings may be explored for lower temperature applications, such as the use of polymer composites formed from appropriate enhanced TE materials. The current produced within the spray-on thermoelectric generator will have to be efficiently converted into an electrical current suitable for the charging of advanced rechargeable batteries, such as lithium ion batteries.

Other possibilities exist for the production of thermoelectric coatings for photo-thermal conversion. For example, powders of p-type bismuth-antimony-telluride alloys can be coated as patches onto the backside of a solar-absorbing metallic current collector with high surface area. Similarly, powders of re-type bismuth-telluride-selenide can be coated as adjacent patches on the backside of a solar-absorbing metallic current collector with high surface area. Regions between the n-type and p-type patches are filled with a dielectric material. Adjacent patches on the back side of the foil or plates for p-n junctions for photo-thermal conversion. The current collector can be made from a foil or plate.

Alternatively, the n-type and p-type coatings of thermoelectric materials can be coated onto n-type and p-type current-collector traces (buses), that are formed on an insulating dielectric substrate, which may include ceramic tiles. The outer surface is covered with a layer having metallic conduction, thereby forming a thermoelectric coating for photo-thermal or waste-heat conversion. These coatings may also be applied to the outer surface of process piping for energy conversion.

Figure 3:
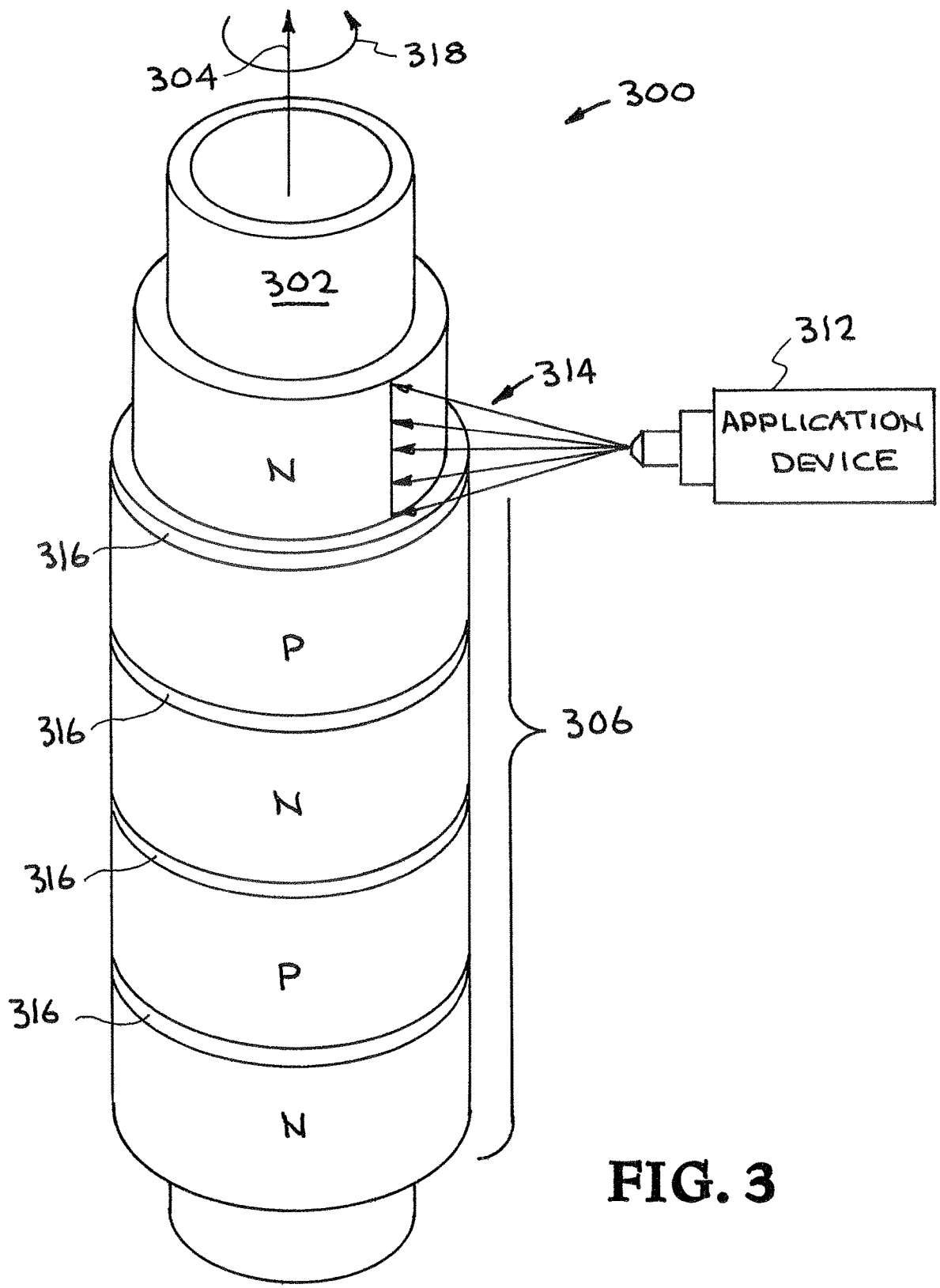
FIG. 3 illustrates one version of the present invention.

Referring now to FIG. 3, one embodiment of a system of the invention is illustrated. The system is designated generally by the reference numeral 300. The system 300 is a process of applying the N-P junctions of the invention. The system 300 includes the following components: N-P junctions 306 being applied to a conduit, pipe, or flue 302 by an application device 312; the hot medium 304 in the conduit, pipe, or flue 302; N-P junctions 306; application device 312; material 314 being applied to the conduit, pipe, or flue 302; separators 316; and rotation arrow 318. The system 300 is a process of applying the N-P junctions that includes the steps of applying a coating of an N-material to a conduit producing an N-junction on the conduit, applying a coating of a P-material to the conduit producing a P-junction on the conduit, providing a separator on the conduit between the N-junction on the conduit and the P-junction on the conduit, and providing electrical connections for the N-junction and the conduit and the P-junction. In addition to the coating being applied to the conduit, pipe, or flue 302, the coating 306 can be applied by other application processes and can be applied to other shapes of support structures.

In another embodiment, the system 300 is a process of applying the N-P junctions that includes the steps of applying an insulator coating to the conduit between the coating of an N-material and the conduit; and applying an insulator coating to the conduit between the coating of a P-material and the conduit. Alternative methods of producing rings may be explored for lower temperature applications, such as the use of polymer composites formed from appropriate enhanced TE materials. The current produced within the spray-on thermoelectric generator will have to be efficiently converted into an electrical current suitable for the charging of advanced rechargeable batteries, such as lithium ion batteries.

The N-P junctions coating 306 is shown in FIG. 3 as being applied by a spray process. A spray device 312 is shown applying a spray 314 to the conduit, pipe, or flue 302. For example, bismuth, antimony and lead telluride alloys deposited cold spray technology can be used for relatively low to intermediate temperatures, while doped silicon-germanium alloys deposited with advanced thermal spray processes may be ideal for high-temperature applications.

Other possibilities exist for the production of thermoelectric coatings for photo-thermal conversion. For example, powders of p-type bismuth-antimony-telluride alloys can be coated as patches onto the backside of a solar-absorbing metallic current collector with high surface area. Similarly, powders of re-type bismuth-telluride-selenide can be coated as adjacent patches on the backside of a solar-absorbing metallic current collector with high surface area. Regions between the n-type and p-type patches are filled with a dielectric material. Adjacent patches on the back side of the foil or plates for p-n junctions for photo-thermal conversion. The current collector can be made from a foil or plate.

Alternatively, the n-type and p-type coatings of thermoelectric materials can be coated onto n-type and p-type current-collector traces (buses), that are formed on an insulating dielectric substrate, which may include ceramic tiles. The outer surface is covered with a layer having metallic conduction, thereby forming a thermoelectric coating for photo-thermal or waste-heat conversion. These coatings may also be applied to the outer surface of process piping for energy conversion.

In this figure, FIG. 3, we see a pipe or flue 302 with alternating layers of P-material and N-material being applied to the outer surface of pipe 302 by an application device 312. As shown here the device 312 produces a spray 314 that coats the outer surface of the pipe 302 as the pipe is rotated as indicated by arrow 318. The alternating rings of N-P material 306 are spaced apart by the separators 316. This TEG has a hot medium flowing through as indicated by the arrow 304. A more detailed description and illustration of the construction of the N-P junctions of this invention will be described subsequently and will be illustrated in other figures, particularly as it appears in FIG. 6.

Figure 4A:
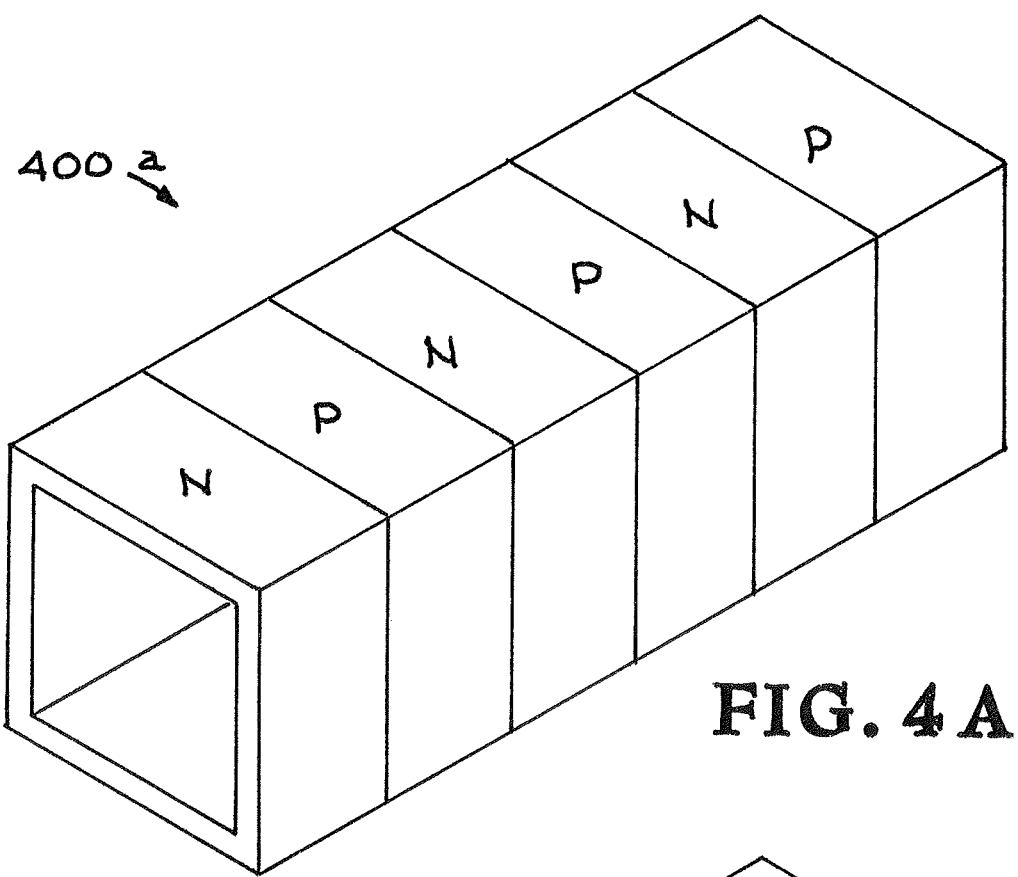
FIG. 4A and FIG. 4B illustrate the process of applying the N-P junctions of the invention.
Figure 4B:
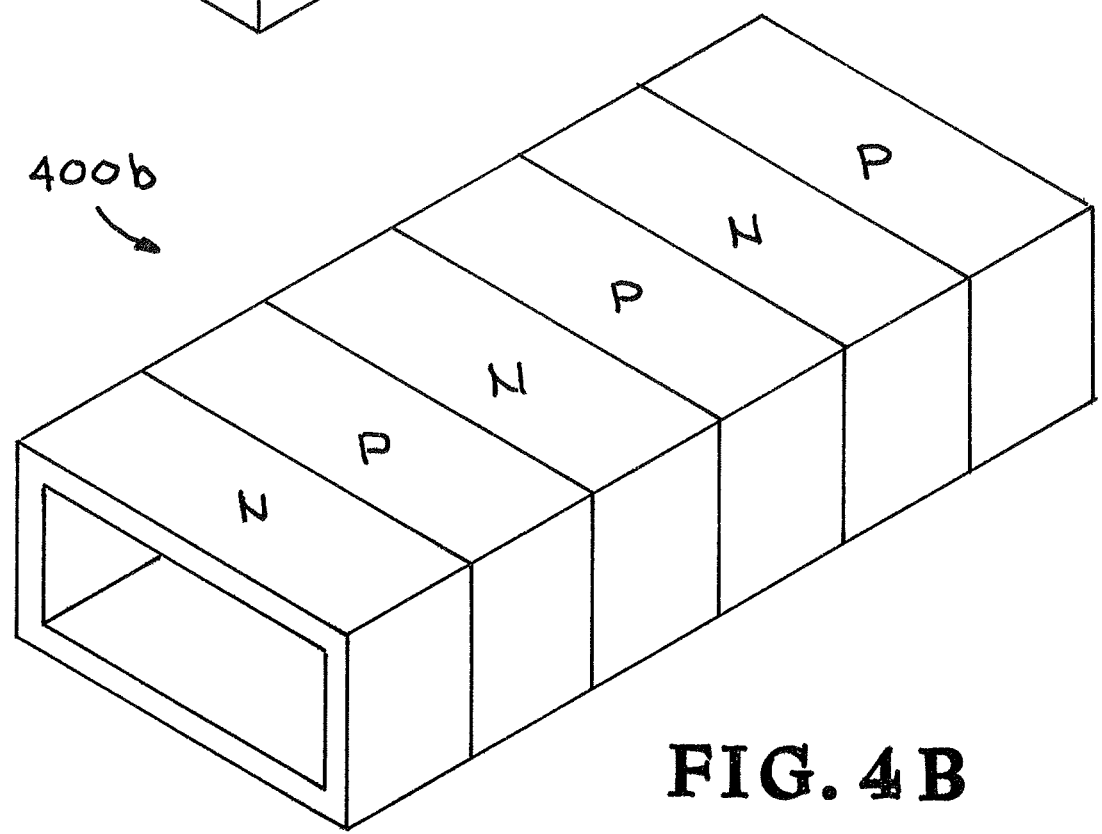

Referring now to FIG. 4A and FIG. 4B, a process of applying the N-P junctions of the invention is illustrated showing that it can also be adapted to shapes other then the tubular one shown in FIGS. 1, 2, and 3. FIG. 4A is essentially a square shaped flue, while FIG. 4B is of a rectangular configuration.

Figure 5:
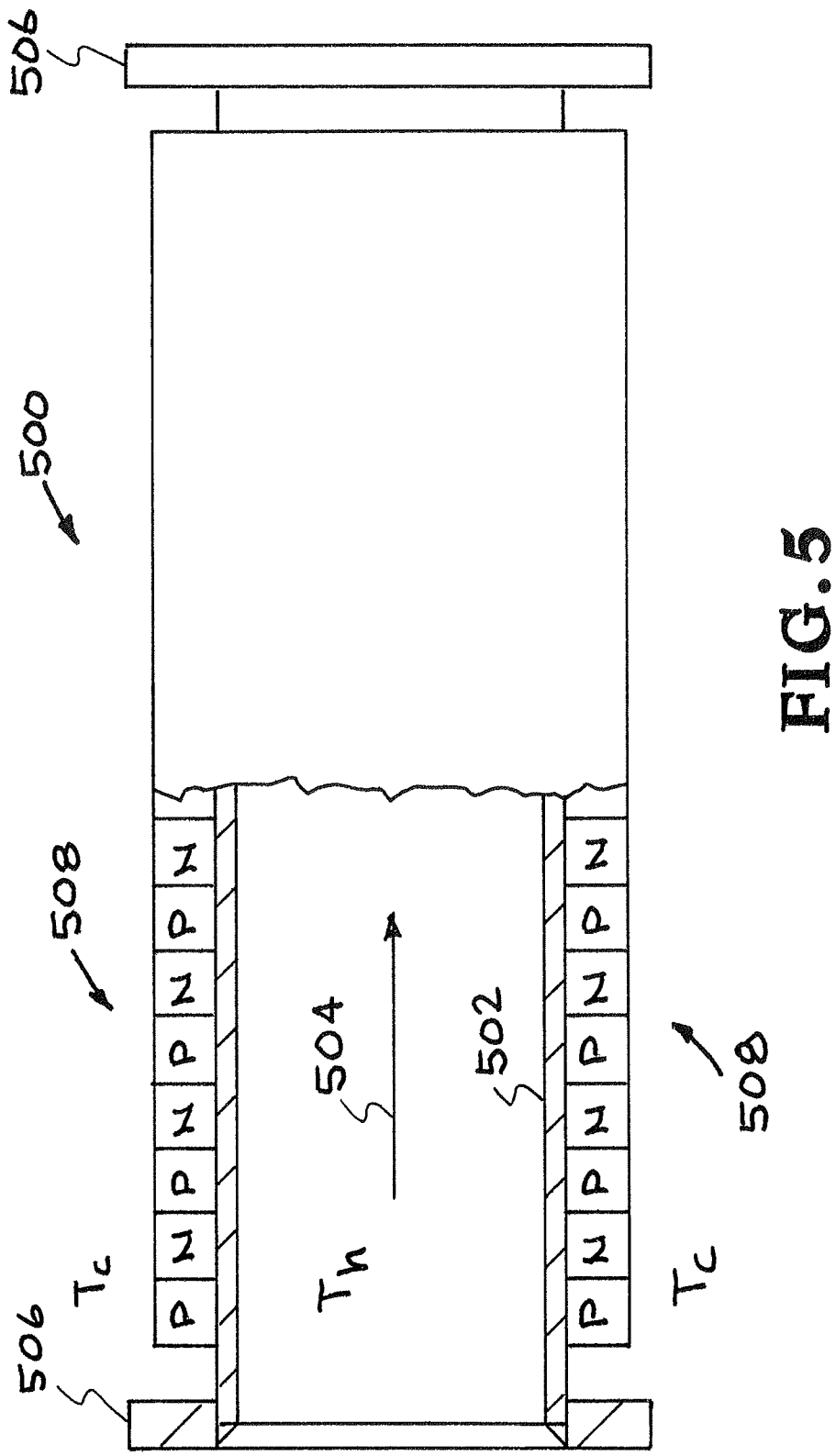
FIG. 5 illustrates a partially sectioned view of a TEG device that could be easily incorporated into a waste heat system.

Referring now to FIG. 5, a partially sectioned view of a TEG device that could be easily incorporated into a waste heat system is shown. The system illustrated in FIG. 5 is designated generally by the reference numeral 500. The illustration in FIG. 5 is a simplified illustration of a TEG device. The system 500 includes the following components: a conduit, pipe or flue 502; the flow of hot medium 504, flanges 506, and N-P junction arrays 508.

A pipe or flue 502 with hot medium 504 flowing through the pipe is close to completely covered by N-P junctions. The flanges 506 at both ends of the device 500 would allow for easy installation. The system 500 provides a system for the recovery of waste heat from various sources including chemical processes, vehicle exhaust, and solar power plants. The system 500 can have a cylindrical annular geometry which is ideal for process heat exchanger and exhaust manifold applications.

The system 500 has N-P junctions 508 mounted on the outer surface of the conduit, pipe or flue 502. A hot medium 504 flows through the conduit, pipe or flue 502. The p-n junctions 508 operate as thermoelectric power generators. Heat absorbed at the p-n junctions 508 increases the kinetic energy of charge carriers causing migration of the charge carriers to the cold side of the device. This thermally-driven migration of charge carriers is used to drive an electrical current in an external circuit attached to the p and n legs of the device.

Figure 6:
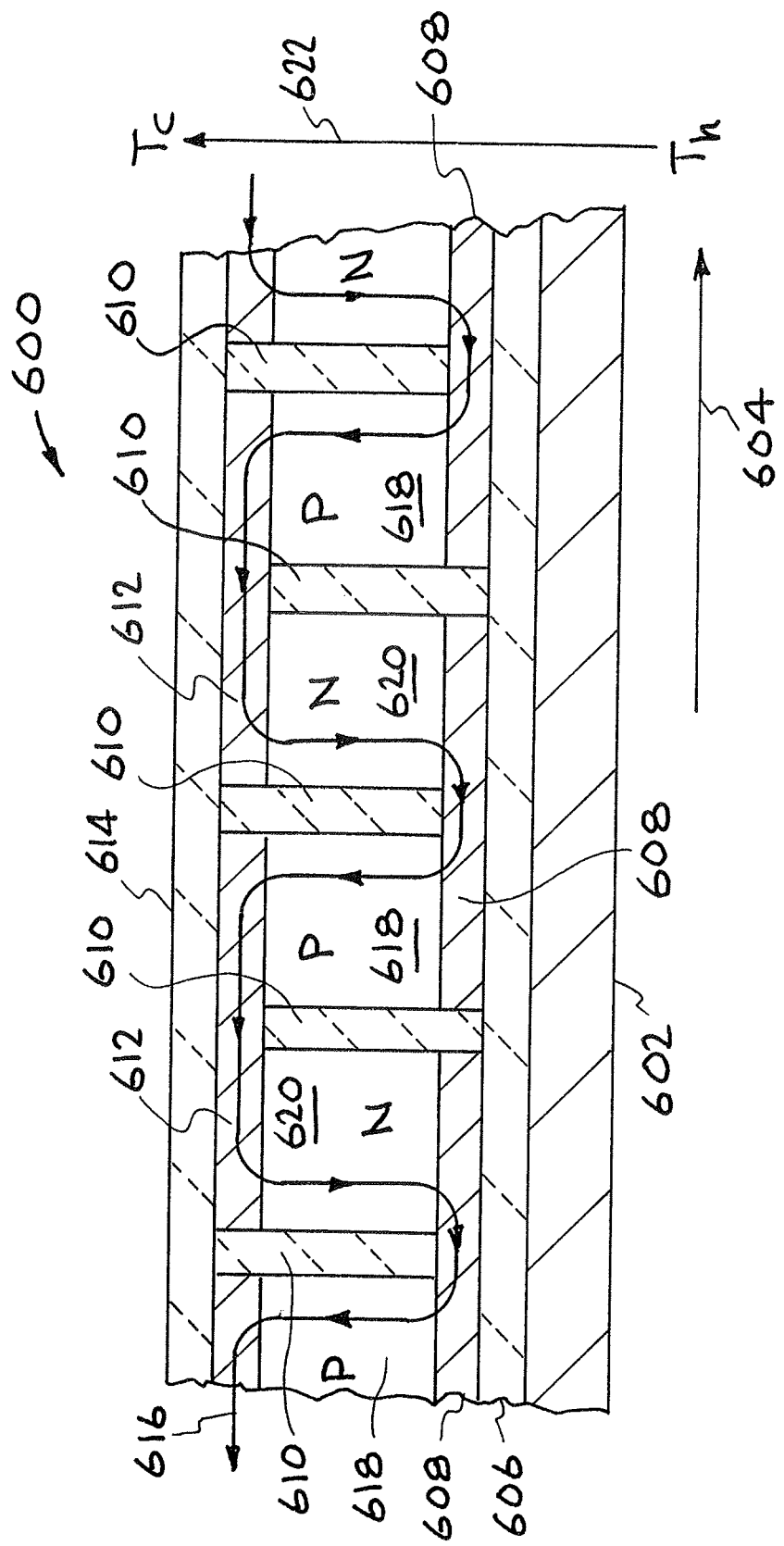
FIG. 6 illustrates of the construction of the N-P junctions of the present invention.

Referring now to FIG. 6, a partially sectioned view of a TEG device that can be incorporated into a waste heat system is shown. The TEG device illustrated in FIG. 6 is designated generally by the reference numeral 600. FIG. 6 is a simplified illustration of the TEG device 600 and helps with a description of the construction of the N-P junctions of the present invention. The TEG device 600 includes the following components: conduit, pipe or flue 602; flow of hot medium 604; electrical isolation 606; conductor 608, electrical isolation 610; conductor 612; electrical isolation 614; current path 616; 618 P-material; 620 N-material; and 622 Heat flow from hot to cool. The TEG device 600 is shown here in a partial section. There is a hot medium 604 flowing through the conduit, pipe, or flue 602. The hot medium flow 604 is illustrated by the arrow identified by the reference numeral 604. There is a heat drop form hot to cool 622. The cool 622 is the ambient air illustrated by the reference numeral 622. The conduit, pipe, or flue 602 is covered by an electrical isolation layer 606 and an interrupted or segmented conductor layer is applied on the electrical isolation layer 606. Electrical isolation walls 610 are applied at intervals as shown. N-P junction materials 618 and 620 are applied alternately between isolation walls 610. Additional interrupted or segmented conductor layer 616 is then applied and construction of the N-P junctions is completed by a final electrical isolation layer 614. The conduction path through the various conductors and N-P materials is shown by line 616. The N-P junction materials 618 and 620 can be electrically connected in series as shown or in parallel.

The TEG device 600 has N-P junctions mounted on the outer surface of the conduit, pipe or flue 602. A hot medium flows through the conduit, pipe or flue 602. The p-n junctions operate as thermoelectric power generators. Heat absorbed at the p-n junctions increases the kinetic energy of charge carriers causing migration of the charge carriers to the cold side of the device. This thermally-driven migration of charge carriers is used to drive an electrical current in an external circuit attached to the p and n legs of the device.

Figure 7:
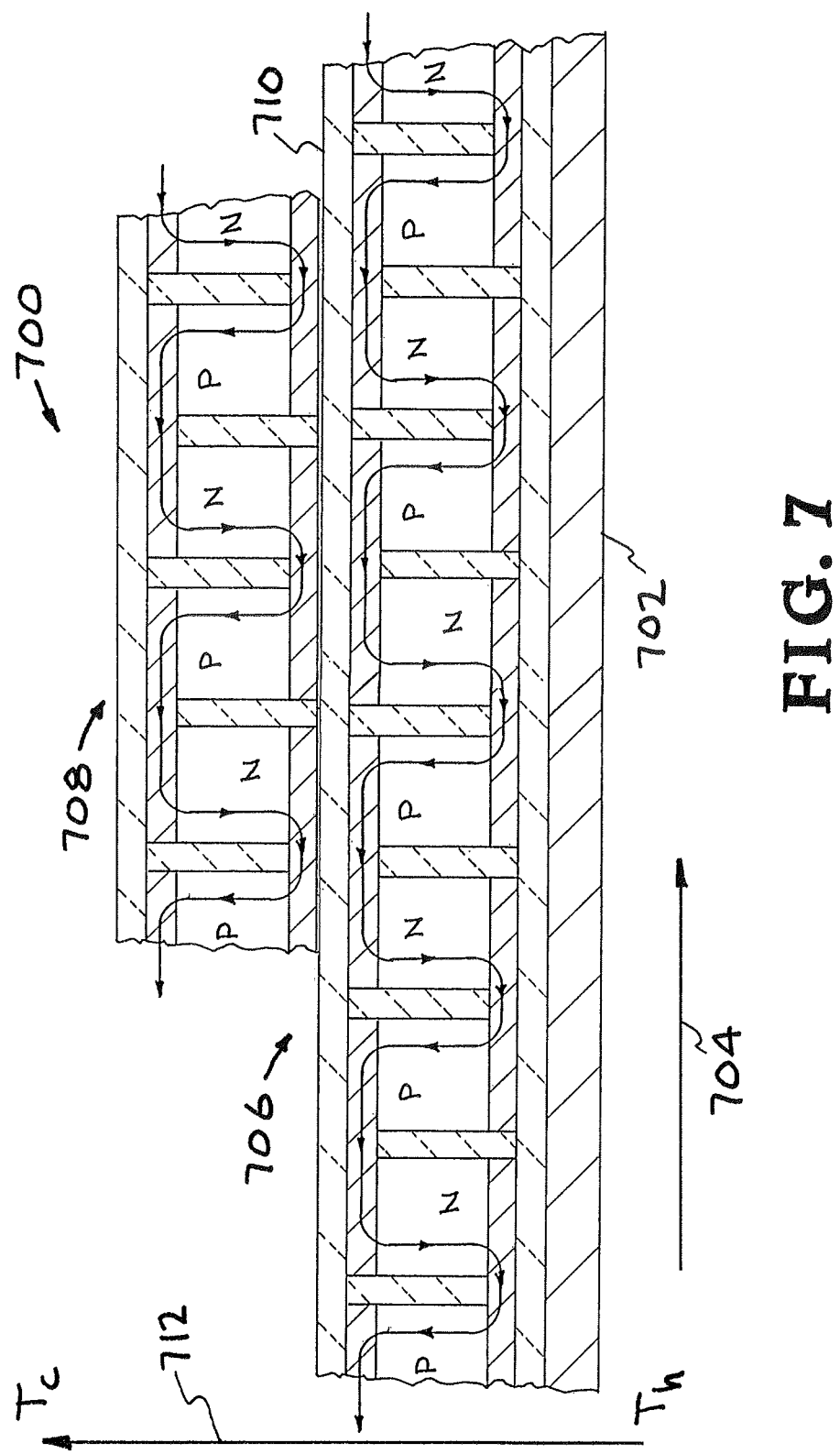
FIG. 7 illustrates a multilayer TEG device in partial section.

Referring now to FIG. 7, an illustration of a multilayer TEG device in partial section is shown. The system illustrated in FIG. 7 is designated generally by the reference numeral 700. The system 700 includes the following components: conduit, pipe, or flue 702; flow of hot medium 704; N-P junction first layer 706; N-p junction second layer 708; electrical isolation 710; and heat flow from hot to cool 712. The individual N-P junction layers 708 and 706 are constructed as previously described in connection with FIG. 6. The two N-P junction layers 708 and 706 that are shown here are separated by an electrical isolation layer 710. The arrow 704 indicates the flow of a hot medium through the pipe 702 and the arrow 712 shows the flow of heat across the N-P junctions from hot to cool.

The system 700 has multilayer N-P junctions mounted on the outer surface of the conduit, pipe or flue. A hot medium flows through the conduit, pipe or flue. The p-n junctions operate as thermoelectric power generators. Heat absorbed at the p-n junctions increases the kinetic energy of charge carriers causing migration of the charge carriers to the cold side of the device. This thermally-driven migration of charge carriers is used to drive an electrical current in an external circuit attached to the p and n legs of the device.

Figure 8:
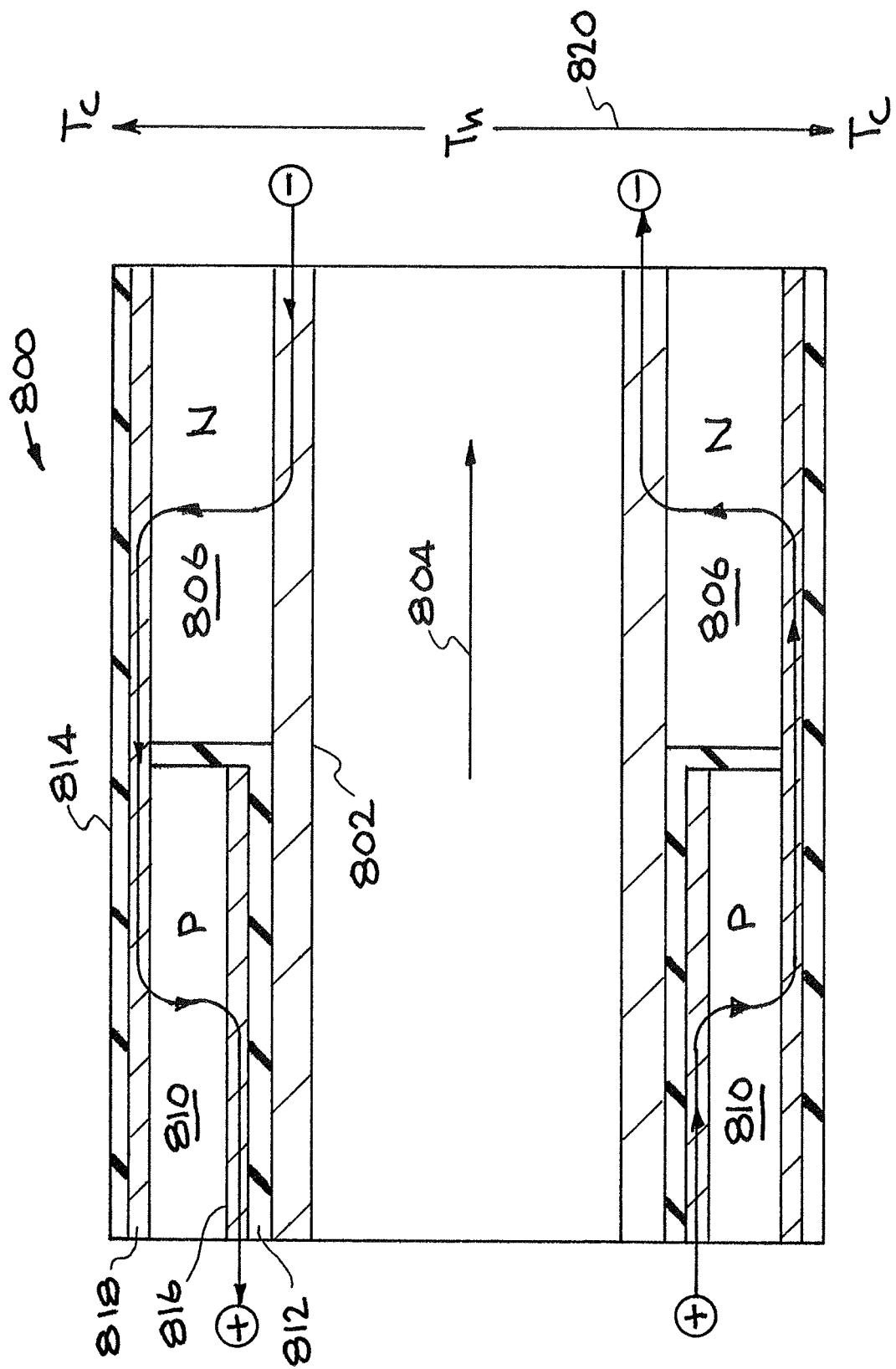
FIG. 8 illustrates a TEG 800 device with an alternate current path.

Referring now to FIG. 8, a TEG 800 device with an alternate current path is shown. The system illustrated in FIG. 8 is designated generally by the reference numeral 800. The system 800 includes the following drawing components: TEG 800 with alternate current path, conduit, pipe or flue 802, flow of hot medium 804, N-material 806, P-material 810, electrical isolation 812, electrical isolation 814, conductor 816, conductor 818, and heat flow 820 hot to cool. As in previously illustrated TEG devices of the present invention the N-P junctions are formed on the outer surface of a pipe or flue 802 with a hot medium 804 flowing through the pipe. As illustrated in FIG. 8, N-material 806 is deposited on a portion of pipe 802. Next an electrical isolation layer and wall 812 is deposited on an adjacent portion of pipe 802. Next a layer of conducting material 816 is formed on the electrical isolation layer 812, then P-material 810 is deposited on the conduction layer 816. Now another layer of conductor material 818 is deposited to complete the current path shown as a line with arrows. The current path goes through the pipe 802 and proceeds through the N-material 806, conductor 818, P-material 810 and conductor 816. A final layer 814 of electrical isolation material completes the formation of the TEG device 800.

The present invention provides practical, thermoelectric devices with ZTs of at least 3.0 to as high as 4.0, substantially higher than the current ZTs of up to 1.5. This provides the potential to achieve new records for thermoelectric devices by achieving overall efficiencies of >30%, depending on Tc/Th. The present invention can substantially lower the manufactured cost of these devices, opening up huge potential markets which can have a dramatic impact on energy efficiency. Thermoelectric devices can be used for the recovery of heat from chemical process equipment, the exhaust of gasoline and diesel powered vehicles, and molten salts used to carry heat away from central solar receivers in power plants. Such thermoelectric devices are p-n junctions in which heating of the junction induces the flow of electrical current.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. A method of harvesting energy, comprising the steps of:
providing a waste heat recovery pipe having an outer surface, a first waste heat recovery pipe end, and a second waste heat recovery pipe end;
providing a hot medium in said waste heat recovery pipe;
providing a N-material spray containing N-material wherein said N-material can be directed to said outer surface of said waste heat recovery pipe;
coating said waste heat recovery pipe with multiple sections of said N-material by rotating said pipe and using said N-material spray to direct said N-material to said outer surface of said waste heat recovery pipe with said hot medium in said waste heat recovery pipe producing multiple N-junction sections on said waste heat recovery pipe;
providing a P-material spray containing P-material wherein said P-material can be directed toward said outer surface of said waste heat recovery pipe;
coating said waste heat recovery pipe with multiple sections of said P-material by rotating said pipe and using said P-material spray to direct said P-material toward said outer surface of said waste heat recovery pipe with said hot medium in said waste heat recovery pipe producing multiple P-junction sections on said waste heat recovery pipe;
providing a separator material spray containing separator material that can be directed between said N-material and said P-material on said waste heat recovery pipe;
positioning multiple separator sections made of said separator material on said waste heat recovery pipe between said multiple N-junction sections and said multiple P-junction sections by rotating said waste heat recovery pipe and using said separator material spray to direct said separator material between said multiple N-junction sections and said multiple P-junction sections;
providing electrical connectors electrically connected to said multiple N-junction sections and said multiple P-junction sections;
providing an external circuit;
providing a first flange on said first waste heat recovery pipe end;
providing a second flange on said second waste heat recovery pipe end;
locating a vehicle exhaust system source of waste heat;
installing said waste heat recovery pipe to said vehicle exhaust system source of waste heat using said first flange and said second flange; and
directing a hot medium from said vehicle exhaust system source of waste heat into said first waste heat recovery pipe end installed to said installed to said vehicle exhaust system by said first flange and into said waste heat recovery pipe wherein said multiple N-junction sections and said multiple P-junction sections produce an electrical current that is directed to said electrical connectors and said external circuit thereby harvesting energy.

2. The method of harvesting energy of claim 1 wherein said step of locating a vehicle exhaust source of waste heat comprises locating a gasoline powered vehicle exhaust source of waste heat.

3. The method of harvesting energy of claim 1 wherein said step of locating a vehicle exhaust source of waste heat comprises locating a diesel powered vehicle exhaust source of waste heat.

* * * * *